(12) United States Patent
Adamec et al.

(10) Patent No.: US 8,878,148 B2
(45) Date of Patent: Nov. 4, 2014

(54) METHOD AND APPARATUS OF PRETREATMENT OF AN ELECTRON GUN CHAMBER

(75) Inventors: Pavel Adamec, Haar (DE); Ivo Liška, Haar (DE); Gennadij Gluchman, Munich (DE); Milan Snabl, Unterschleissheim (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 0 days.

(21) Appl. No.: 12/888,978

(22) Filed: Sep. 23, 2010

(65) Prior Publication Data

US 2011/0084219 A1    Apr. 14, 2011

(30) Foreign Application Priority Data

Oct. 13, 2009  (EP) ..................... 09172942

(51) Int. Cl.
*G21K 5/00* (2006.01)
*H01J 37/06* (2006.01)

(52) U.S. Cl.
CPC ....... *H01J 37/06* (2013.01); *H01J 2237/06316* (2013.01); *H01J 2237/022* (2013.01); *H01J 2237/06341* (2013.01)
USPC ................ 250/492.3; 250/492.1; 250/310; 250/311

(58) Field of Classification Search
CPC .................................. H01J 37/06; H01J 3/02
USPC ................ 250/492.1, 306, 310–311, 492.3
See application file for complete search history.

(56) References Cited

U.S. PATENT DOCUMENTS

| 5,135,775 | A | 8/1992 | Foller et al. |
| 6,943,351 | B2* | 9/2005 | Parker et al. ..................... 850/6 |
| 7,005,634 | B2* | 2/2006 | Shiokawa et al. ............. 250/288 |
| 7,355,186 | B2* | 4/2008 | Jasinski ......................... 250/431 |
| 2002/0015143 | A1 | 2/2002 | Yin et al. |
| 2002/0136674 | A1* | 9/2002 | Vane ......................... 422/186.07 |
| 2005/0001178 | A1* | 1/2005 | Parker et al. ............... 250/494.1 |
| 2007/0051866 | A1 | 3/2007 | Yen et al. |
| 2008/0041415 | A1* | 2/2008 | Demos et al. .................. 134/1.3 |
| 2009/0014644 | A1* | 1/2009 | Yang et al. ..................... 250/288 |

FOREIGN PATENT DOCUMENTS

| JP | 55130052 A | 10/1980 |
| JP | 01128337 A * | 5/1989 |
| JP | 2007172862 A | 7/2007 |

OTHER PUBLICATIONS

Examination Report mailed Jan. 20, 2012, in European Application 09 172 942.6.

* cited by examiner

*Primary Examiner* — Nicole Ippolito
*Assistant Examiner* — Wyatt Stoffa
(74) *Attorney, Agent, or Firm* — Patterson & Sheridan, LLP

(57) ABSTRACT

A method of pre-treating an ultra high vacuum charged particle gun chamber by ion stimulated desorption is provided. The method includes generating a plasma for providing a plasma ion source, and applying a negative potential to at least one surface in the gun chamber, wherein the negative potential is adapted for extracting an ion flux from the plasma ion source to the at least one surface for desorbing contamination particles from the at least one surface by the ion flux impinging on the at least one surface.

21 Claims, 3 Drawing Sheets

METHOD AND APPARATUS OF PRETREATMENT OF AN ELECTRON GUN CHAMBER

FIELD OF THE INVENTION

Embodiments of the present invention relate to a method of pre-treating an electron gun chamber, in particular an ultra high vacuum chamber such as an ultra high vacuum chamber including a Schottky emitter or cold field emitter. More specifically, the embodiments relate to a method of pre-treating an electron gun chamber by stimulated desorption. The embodiments also relate to an electron gun chamber adapted for conducting the pre-treating methods.

BACKGROUND OF THE INVENTION

Charged particle beam apparatuses are used in a plurality of industrial fields. Inspection of semiconductor devices during manufacturing, exposure systems for lithography, detecting devices and testing systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

Generally, charged particle beam devices are operated under vacuum conditions to avoid, e.g. ionization of surrounding gases. In spite of that, electrons impinging on component surfaces of the device, like extractors, anodes, apertures or the chamber wall result in an emission of contaminants. This phenomenon is known as electron stimulated desorption (ESD). Thus, a shower of residual gas is generated. The residual gas contains molecules which can be hit by electrons. Thereby, ions, ionized molecules and other particles such as electrons can be created. In the case of particles having a charge which is opposite to the charge of the charged particles emitted by an emitter, the particles in the residual gas are accelerated towards the emitter. As a result, the emitter can be mechanically deformed from the impingement of the ions and ionized molecules or these particles can be deposited on the emitter. Thus, emitter noise is introduced.

Present approaches for pretreatment of the device are not completely satisfactory. For example, in a pretreatment using heating, the thermal energy may be too low to desorb chemically adsorbed particles from the surfaces of the device. Even with a pretreatment making use of ESD, the time needed for pretreatment may be excessively long, e.g. several days to weeks.

SUMMARY

In light of the above, a method according to claim 1 and an apparatus according to claim 9 are provided. Further details are to be found in the dependent claims, the description, and the drawings.

According to one embodiment, a method of pre-treating an ultra high vacuum charged particle gun chamber by ion stimulated desorption is provided. The method includes generating a plasma for providing a plasma ion source, and applying a negative potential to at least one surface in the gun chamber, wherein the negative potential is adapted for extracting an ion flux from the plasma ion source to the at least one surface for desorbing contamination particles from the at least one surface by the ion flux impinging on the at least one surface.

According to a further embodiment, an ultra high vacuum charged particle gun chamber adapted for pre-treatment by ion stimulated desorption is provided. The charged particle gun chamber includes a charged particle emitter for generating a charged particle beam, and a gas inlet for introducing a plasma generating gas. The charged particle gun chamber further includes a discharge electrode for generating a plasma from the plasma generating gas as a plasma ion source. The charged particle gun chamber also includes at least one beam shaping element. At least one critical surface of the at least one beam shaping element is electrically connected to the high voltage power supply and the negative potential is adapted for extracting an ion flux from the plasma ion source to the at least one critical surface to desorb contamination particles therefrom.

The disclosure is also directed to an apparatus for carrying out the disclosed methods, including apparatus parts for performing each of the described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

So that the manner in which the above recited features can be understood in detail, a more particular description may be had by reference to embodiments. The accompanying drawings relate to embodiments and are described in the following.

DETAILED DESCRIPTION OF THE INVENTION

Figure 1:
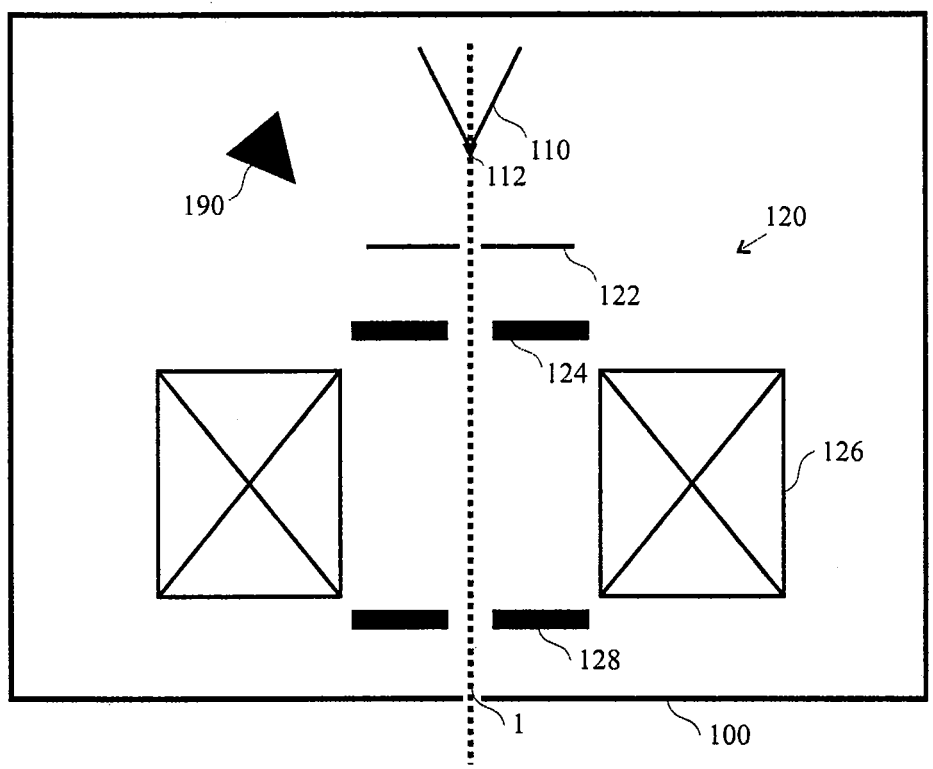
FIG. 1 shows a schematic side view of an electron gun chamber with a cleaning emitter.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Within the following description of the drawings, the same reference numbers refer to the same components. Generally, only the differences with respect to the individual embodiments are described. The structures shown in the drawings are not depicted true to scale but rather serve only for the better understanding of the embodiments.

In the following, without limiting the scope, charged particles, charged particle gun chambers, charged particle devices etc. will be referred to as electrons, electron gun chambers, electron beam devices etc., respectively. Embodiments described herein shall include modifications such as using ions, ion beam devices etc. instead. Specified voltages etc. may have to be inverted, i.e., their sign changed, if positively charged particles are used for the intended operation.

During intended use, e.g. inspection, imaging, testing or patterning of a specimen or sample, the electron emitter emits an electron beam along a beam axis. On the one hand, the term "intended use" as referred to herein is to be understood as conducting measurements or specimen modification, e.g. including at least one use selected from the group consisting of: inspection, imaging, testing, patterning for lithography or the like. The intended use depends on the purpose which the electron beam device has. On the other hand, the embodiments described herein refer to a pretreatment of the gun chamber, e.g. including at least one pretreatment step from the group consisting of: cleaning steps, alignment steps, calibration steps or other maintenance operations. Embodiments also refer to an apparatus or arrangement to conduct such pretreatment.

The term "critical surface" as used herein refers to a surface, which can be hit by electrons of the electron beam during the intended use. That means, typically, that a critical surface is hit by electrons of the electron beam emitted from the emitter in the gun chamber for inspection or manipulation of a sample. Such a critical surface can be the surface of at least one beam shaping element or the surface of at least one wall of the gun chamber.

Generally, a beam shaping element as referred to herein is an element of the gun chamber or the electron beam device that influences the electron beam. A typical group of beam shaping elements consists of: an extractor, an anode, a condenser lens, and an aperture. The at least one beam shaping element can be selected from this group of beam shaping elements. However, the at least one beam shaping element may, additionally or alternatively, be selected from different elements, e.g. lenses such as an objective lens, electrodes such as a Wehnelt grid, deflection plates or coils, or detectors.

Electrons impinging on any components like an extractor, anode, lens, or the like cause the release of molecules from the surfaces hit by the electrons. Thereby, a shower of residual gas is created, known as electron stimulated desorption (ESD). This residual gas can be ionized by the electron beam. Positively charged ions of the ionized residual gas are accelerated towards emitter. The ions, accelerated to high energies, can either be deposited on the electron beam emitter or mechanically deform the emitter. Thereby, the electron beam current is influenced by these ions and current noise and/or damage of the emitter occurs.

A pretreatment of the gun chamber may be conducted. For example, the gun chamber may be thermally heated. However, the thermal energy may be insufficient to desorb chemically adsorbed particles. In a different approach, shown in FIG. 1, pretreatment is supported by electrons and will be described in the following. In FIG. 1, a field emitter 110 including an emitter tip 112 is shown. If high voltages are applied between the emitter and the extractor 122, the field emitter emits charged particles, e.g. electrons along optical axis 1. Further, an anode 124 and aperture 128 are provided. The anode and aperture are used for acceleration of the electrons and beam shaping. Further, condenser lens 126 can be used to image the electron source or a beam crossover acting as a virtual electron source. These beam shaping elements 122, 124, 126, 128 form beam shaping means 120.

Before operating the charged particle beam device, it has to be evacuated. After a certain vacuum level has been reached, an electron gun 190 with a high current floods the chamber with electrons. The emitted electrons impinging on the walls or other surfaces of parts of the column and additional detach volatile molecules from the surfaces of the column. Thereby, residual gas is created. The residual gas gets pumped out of the chamber by vacuum pumps.

As a result, within this cleaning step, residual gas in the form of molecules attached to column surfaces gets pumped out of the column before the intended use of the charged particle device starts. On the one hand, ions created during the cleaning step do not damage field emitter 110 and are hardly deposited thereon. On the other hand, the molecules and ions possibly damaging the field emitter during intended use are pumped out of the chamber.

Desorption of molecules by a pretreatment including ESD as described above can take a very long time e.g. several days to a few weeks. If the gun chamber is used before the critical surfaces are sufficiently freed of contaminants, ESD during the intended use will result. ESD during the intended use is possibly harmful to components of the gun chamber such as the emitter.

To avoid ESD during the intended use, surfaces, in particular critical surfaces of the gun chamber, can be pretreated according to embodiments described in the following.

According to embodiments described herein, methods of pre-treating an electron gun chamber are provided. Typically, the electron gun chamber is an ultra high vacuum electron gun chamber or field emitter electron gun chamber. Therein, an ultra high vacuum may be vacuum with residual pressure in the range from 50 pPa to 500 nPa ($3.8 \cdot 10^{-13}$ Torr to $3.8 \cdot 10^{-9}$ Torr), more typically from 133 pPa to 133 nPa ($10^{-12}$ Torr to $10^{-9}$ Torr), such as 1 nPa ($7.5 \cdot 10^{-12}$ Torr). Field emitters such as a Schottky emitter or cold field emitter require such an ultra high vacuum for operation. However, at ultra high vacuum conditions, the residual pressure is dominated by ESD of the electron beam generated by the emitter during the intended use. To maintain operability and avoid damages to the emitter, ESD must be reduced or even eliminated by an efficient pretreatment of the gun chamber, especially of its critical surfaces.

According to some embodiments, which can be combined with other embodiment described herein, an ultra high vacuum is a vacuum with residual pressure in the range from 50 pPa to 500 nPa ($3.8 \cdot 10^{-13}$ Torr to $3.8 \cdot 10$ Torr), more typically from 133 pPa to 133 nPa ($10^{-12}$ Torr to 10 Torr), such as 1 nPa ($7.5 \cdot 10^{-12}$ Torr). The gun chamber can typically be evacuated to an ultra high vacuum.

The method of pre-treating the electron gun chamber is a method of pre-treating the electron gun chamber by ion stimulated desorption. The method includes generating a plasma for providing a plasma ion source. The plasma is typically a low-pressure plasma. If the plasma is a low-pressure plasma, the vacuum in the electron gun chamber need not be broken, or need at least not be completely broken.

According to some embodiments, which can be combined with any other embodiments described herein, the method of pre-treating the electron gun chamber is a method of in situ pre-treating the electron gun chamber. With in situ pretreatment, downtimes of the electron gun chamber or an electron beam device including the gun chamber may be shortened. Typically, contamination by breaking the vacuum may be avoided.

Figure 2A:
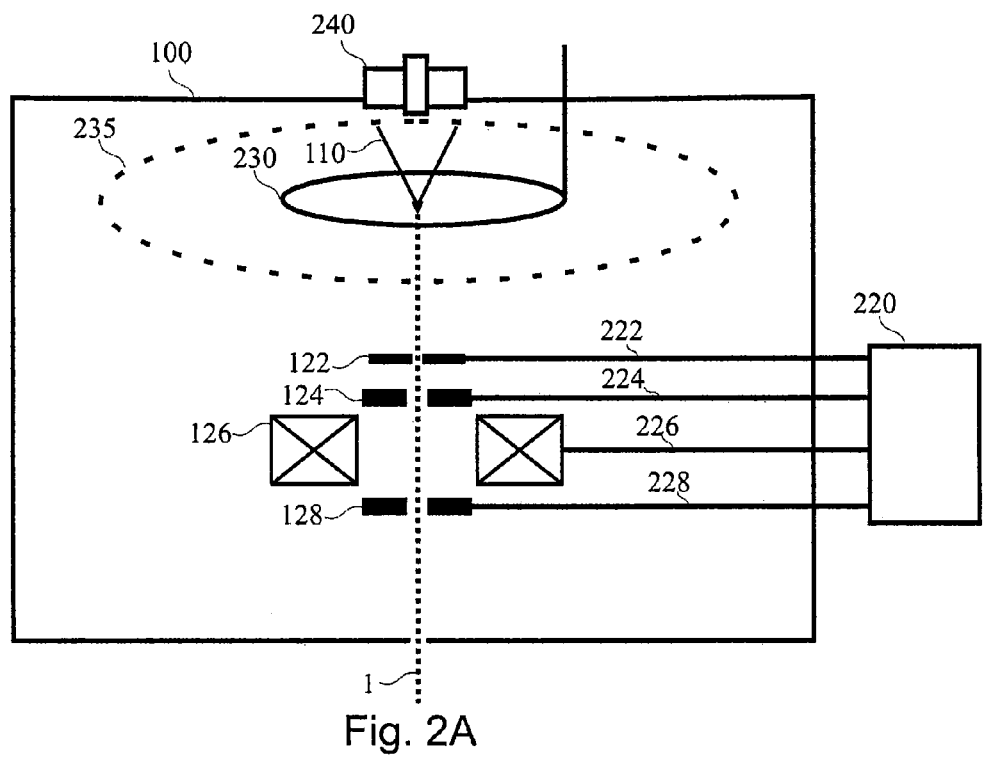
FIGS. 2A-2B show a schematic side view of an electron gun chamber according to embodiments described herein.
Figure 2B:
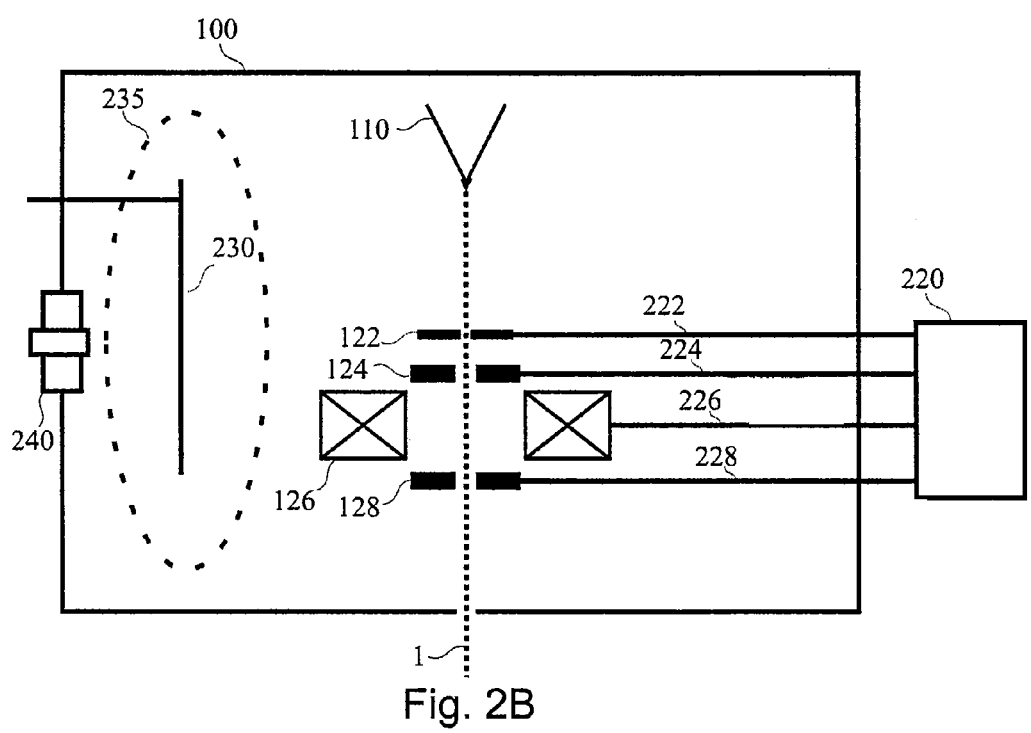

In some embodiments, as shown in FIGS. 2A and 2B, a plasma 235 may be generated by a discharge electrode 230 in the gun chamber 100. The plasma may be generated in a plasma region 235. FIG. 2A shows an emitter 110 for emitting a primary electron beam 1 during the intended use and at least one beam shaping element for shaping the electron beam 1 during the intended use, e.g. at least one of an extractor 122, an anode 124, an aperture 128, and a condenser lens 124. FIG. 2A further shows a gas inlet 240 for introducing a plasma generating gas and a voltage supply 220 for providing voltages to the beam shaping elements. The voltage supply 220 may provide voltages to at least one beam shaping element. The at least one beam shaping element can be an element selected from the group including the extractor 122, the anode 124, the aperture 128, and the condenser lens 126, e.g., via electrical connections 222, 224, 226, 228 through corresponding feedthroughs.

In some embodiments, as shown in FIG. 2A, the discharge electrode may be located near or around the electron emitter 110. The emitter can for example be a field emitter such as a Schottky emitter or a cold field emitter. In contrast to the intended use, the electron emitter 110 may not be biased during pretreatment. Thus, ions or electrons from the ionized residual gas are not accelerated directly towards electron emitter 110.

The discharge electrode may be located at the same distance from the top of the chamber 100, or from the gas inlet 240, as the emitter 110 or the emitter tip. The discharge electrode may be arranged in a ring-like form surrounding the emitter. Typically, the discharge electrode can be ring-like, wherein the emitter tip is in the center of the ring-like discharge electrode. In this way, a plasma acting as a plasma ion source may allow for an ion flux having substantially the same origin as the electron beam during intended use. Thereby, the critical surfaces impinged by the electron beam 1 during intended use may also be directly accessed by the ion flux.

Generally, a counter-electrode for the discharge electrode is provided. The counter-electrode may, in some embodiments, be identical to the at least one beam shaping component, e.g. at least one of the extractor 122, the anode 124, the condenser lens 126, and the aperture 128. In other embodiments, the counter-electrode can be a separate element.

In yet further embodiments, which can be combined with any other embodiments described herein, for example as shown in FIG. 2B, the discharge electrode may be arranged at the side of the chamber. The discharge electrode may be a simple plate electrode. There may be less space confinement for building the discharge electrode within the gun chamber in these embodiments. To direct the ion flux to the critical surfaces, additional components for controlling the plasma region 235 and/or ion flux controlling components such as elements selected from the group consisting of electrodes, counter-electrodes, apertures and magnets may be provided.

In alternative embodiments, the plasma ion source is a remote ion source, and the plasma or the ion flux may be introduced to the gun chamber through corresponding openings, e.g. openings in the top of the gun chamber, for introducing the ion flux substantially along the direction of the electron beam 1. In these alternative embodiments, the gas inlet 240 may be replaced by a plasma inlet or an ion flux inlet.

According to some embodiments, which can be combined with any other embodiments described herein, generating a plasma includes applying a discharge voltage to the discharge electrode. The discharge voltage is typically from 100 V to 1500 V, more typically from 200 V to 1000 V, e.g. 500 V. Generating the plasma may include generating the plasma by direct current discharge or high frequency discharge.

In some embodiments, the method further includes introducing a gas or a gas mixture to the electron gun chamber for generating the plasma therefrom. As shown in FIGS. 2A and 2B, the gas or gas mixture may be introduced by a gas inlet 240. The gas or gas mixture may include at least one of: oxygen, argon, nitrogen, and combinations thereof.

According to embodiments described herein, the method includes applying a negative electric potential to at least one surface in the gun chamber. Typically, the at least one surface is at least one critical surface in the gun chamber. The at least one critical surface can be one critical surface of a beam shaping element or a plurality of critical surfaces of one or more beam shaping elements. For example, as shown in FIGS. 2A and 2B, the at least one surface may include the critical surface of at least one element selected from the group including: the extractor 122, the anode 124, the aperture 128, the condenser lens 124, and inner surfaces of the gun chamber 100.

The negative potential may be applied by a voltage source 220, which may be outside of the gun chamber. In some embodiments, the voltage source 220 is connected at least to the critical surfaces by electric connections. Typically, the electric connections are fed through the walls of the gun chamber. For example, the extractor 122 may be connected to the voltage source 220 by extractor connection 222, the anode 124 by anode connection 224, the aperture 128 by aperture connection 228, and the condenser lens 126 by condenser lens connection 226.

The negative potential is adapted for extracting the ion flux from the plasma ion source to the at least one surface. The negative potential may be from 500 V to 1500 V, typically from 800 V to 1200 V, such as 1000 V. Typical currents of the ion flux to the at least one surface may be from 1 mA to 20 mA, more typically from 5 mA to 15 mA such as 10 mA. The method may include extracting the ion flux from the plasma ion source by the negative potential and/or directing the ion flux to the at least one surface by the negative potential.

According to embodiments described herein, the method includes desorbing contamination particles from the at least one surface by the ion flux, or the ions, respectively, impinging on the at least one surface. Ions, as compared to photons or electrons, may desorb chemically adsorbed contamination particles more efficiently, e.g., faster and/or more thoroughly.

In some embodiments, the method may include removing the desorbed contamination particles from the electron gun chamber. The electron gun chamber may include at least one gas outlet. Typically, the at least one gas outlet is connected to at least one vacuum pump for generating the high vacuum. Removing the desorbed contamination particles may include evacuating the electron gun chamber, typically to an operating pressure from 50 pPa to 500 nPa ($3.8 \cdot 10^{-13}$ Torr to $3.8 \cdot 10^{-9}$ Torr), more typically from 133 pPa to 133 nPa ($10^{-12}$ Torr to $10^{-9}$ Torr), such as 1 nPa ($7.5 \cdot 10^{-12}$ Torr).

Typically, the method of pre-treating the electron gun chamber by ion stimulated desorption is stopped after a treatment time from 1 minute to 20 minutes, more typically from 2 minutes to 10 minutes, such as 5 minutes. Therein, removing of contamination particles can be improved, e.g. generating substantially contamination-free, purely metallic surfaces, in particular critical surfaces. According to some embodiments, which can be combined with any other embodiments described herein, the intended use is started after the treatment time.

According to further embodiments, an electron gun chamber for use in an electron beam device is provided. The electron gun chamber is adapted for pretreatment by ion stimulated desorption. Therein, the electron gun chamber may be adapted for in-situ pretreatment. In particular, the electron gun chamber may be adapted for use in a method of pre-treating an electron gun chamber by ion stimulated desorption according to embodiments described herein.

In some embodiments, the electron gun chamber 100 includes an emitter 110 for generating an electron beam during intended use. The emitter 110 can be an electron field emitter, e.g. a Schottky emitter or cold field emitter.

Therein, a further aspect has to be considered. Typically, the field emitter tip is welded to a wire. For field emission, a high potential is applied to the field emitter. Due to the small radius of curvature of the emitter tip, high electrical fields are obtained. Thereby, electrons can escape from the emitter tip surface. However, these high electrical fields would also act on ionized atoms or molecules, in the case of an insufficient cleaning of the chamber. Due to the small radius of curvature, ionized atoms and molecules desorbed by ESD during the intended use would be directed towards the field emitter tip, possibly impairing its functionality or even destroying it.

Thus, the methods of pre-treating the electron gun chamber by ion stimulated desorption according to embodiments described herein and the embodiments of the electron gun chamber are especially valuable for field emitter gun chambers, in particular for ultra high vacuum field emitter gun chambers. During the cleaning process by ion stimulated desorption, the field emitter does not need to be biased. Thus, there is no focusing force towards emitter tip acting on desorbed, ionized atoms and molecules. However, the present disclosure is not limited to gun chambers with field emitters.

The electron gun chamber may further include the gas inlet 240 for introducing a plasma generating gas or gas mixture. The plasma generating gas or gas mixture can include at least one gas selected from the group consisting of: oxygen, argon, nitrogen. Alternatively, the electron gun chamber may include a plasma inlet for introducing a remotely generated plasma to the gun chamber or may include an ion inlet for introducing a remotely generated ion flux to the gun chamber. Thus, according to some embodiments, which can be combined with other embodiments described herein, the gas inlet is adapted to provide gas in the plasma region, e.g. the region between the discharge electrode and a counter-electrode for generating the plasma. Thereby, typically the gas inlet is adapted to generate a larger pressure-increase in the plasma region as compared to a pressure-increase in other regions of the gun-chamber or of the charged particle beam device.

According to some embodiments, the electron gun chamber includes the discharge electrode 230 for generating the plasma 235 from the plasma generating gas. The discharge electrode 230 can be adapted for direct current discharge or high frequency discharge for generating the plasma. Therein, the plasma can act as an ion source. The discharge electrode may be connected to a DC voltage source or an RF voltage source for applying a DC voltage or a RF voltage to the discharge electrode. The discharge voltage is typically from 100 V to 1500 V, more typically from 200 V to 1000 V, such as 500 V. Typically, the discharge electrode can be ring-like, wherein the emitter tip is in the center of the ring-like discharge electrode. Alternatively, the discharge electrode may be plate-like, e.g. mounted on the side of the gun chamber as in FIG. 2B.

In some embodiments, the electron gun chamber includes at least one inner wall and/or at least one beam shaping element. The at least one beam shaping element can be selected from at least one element selected from the group consisting of: an extractor 122, an anode 124, an aperture 128, and a condenser lens 126.

Typically, the extractor 122, anode 124, aperture 128, condenser lens 126, and possibly the inner walls of the gun chamber, are connected to a voltage source 220, such as a high voltage power supply outside of the gun chamber, via the extractor connection 222, anode connection 224, aperture connection 228, condenser lens connection 226, and possibly an inner wall connection. These connections may pass through feedthroughs in the walls of the electron gun chamber.

The voltage source can be adapted to provide a negative electric potential to at least one surface of these components, in particular to at least one of their critical surfaces. The negative potential may be from 500 V to 1500 V, typically from 800 V to 1200 V, such as 1000 V. Typical currents of the ion flux to the at least one surface may be from 1 mA to 20 mA, more typically from 5 mA to 15 mA such as 10 mA.

The electron gun chamber may further include at least one gas outlet for evacuating the gun chamber. Thereby, desorbed contaminants may be pumped out of the gun chamber. Typically, the at least one gas outlet is connected to at least one vacuum pump for generating a vacuum. The at least one vacuum pump can be adapted for evacuating the electron gun chamber to a typical operating pressure from 50 pPa to 500 nPa ($3.8 \cdot 10^{-13}$ Torr to $3.8 \cdot 10^{-9}$ Torr), more typically from 133 pPa to 133 nPa ($10^{-12}$ Torr to $10^{-9}$ Torr), such as 1 nPa ($7.5 \cdot 10^{-12}$ Torr).

According to further embodiments, the electron gun chamber is subdivided into different chambers. For example, the vacuum required for operation of an electron gun has a lower pressure than the vacuum required close to a specimen. Thus, it is common to provide at least an emitter chamber, and a chamber for other beam shaping means, such as the condenser lens 126 and/or aperture 128.

According to yet further embodiments, an electron beam device for specimen inspection and/or specimen modification is provided. The electron beam device includes the electron gun chamber according to embodiments described herein.

Figure 3:
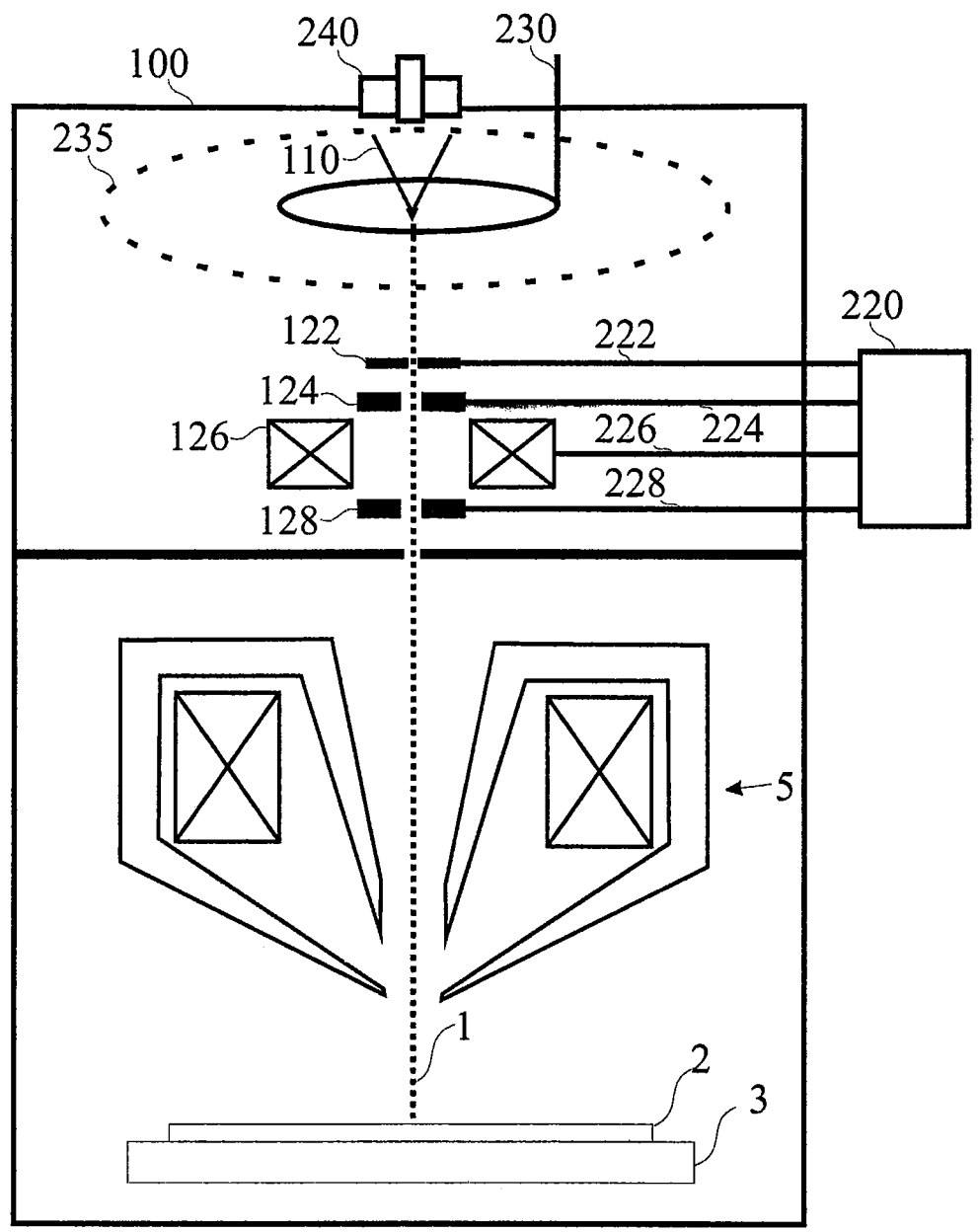
FIG. 3 shows a schematic side view of an electron beam device according to embodiments described herein.

As shown in FIG. 3, the electron beam device may further include a specimen holder 3 for placing a specimen 2 thereon. The electron beam device may further include an objective lens 5 and/or other beam shaping means such as electrodes, apertures or the like. The specimen holder 3 and the beam shaping means such as the objective lens 5 may be housed in a specimen chamber.

The electron beam device may further include vacuum pumps for evacuating the chambers. Typically, two or more vacuum pumps are provided for different chamber portions, respectively, of the charged particle beam device.

The terms and expressions which have been employed herein are used as terms of description and not of limitation, and there is no intention, in the use of such terms and expressions, of excluding any equivalents of the features shown and described or portions thereof. While the foregoing is directed to embodiments, other and further embodiments may be devised without departing from the basic scope, and the scope is determined by the claims that follow.

The invention claimed is:

1. A method of pre-treating an ultra high vacuum electron gun chamber by ion stimulated desorption, wherein the electron gun chamber includes an electron emitter for generating an electron beam, the method comprising:

generating a plasma in a plasma region containing the electron emitter by direct current discharge or by high frequency discharge of a discharge electrode to provide a plasma ion source in the plasma region in the electron gun chamber near the electron emitter; and applying a negative potential to at least one surface in the gun chamber, wherein the negative potential extracts an ion flux from the plasma ion source in the plasma region located near or around the electron emitter to the at least one surface for desorbing contamination particles from the at least one surface by the ion flux impinging on the at least one surface, wherein the electron emitter is not biased during pre-treating the vacuum electron gun chamber, and the ion flux has substantially the same origin as the electron beam generated by the electron emitter during operation.

2. The method according to claim 1, further comprising:
introducing a gas or a gas mixture to the electron gun chamber for generating the plasma therefrom, the gas or the gas mixture comprising at least one of: oxygen, argon, nitrogen, and combinations thereof.

3. The method according to claim 1, wherein the at least one surface comprises a surface of an extractor and an anode.

4. The method according to claim 1, wherein generating the plasma comprises:
applying a discharge voltage of from 200 V to 1000 V to a discharge electrode in the gun chamber.

5. The method according to claim 1, wherein the negative potential is from 500 V to 1500 V.

6. The method according to claim 1, further comprising: removing desorbed contamination particles from the electron gun chamber.

7. The method according to claim 1, further comprising:
removing desorbed contamination particles from the electron gun chamber by evacuating the electron gun chamber to an operating pressure of from 133 pPa to 133 nPa.

8. The method according to claim 1, the method further comprising: stopping pretreatment of the electron gun chamber and starting the intended use of the electron gun chamber.

9. The method according to claim 1, the method further comprising: stopping pretreatment of the electron gun chamber after a pre-treatment time in the range from 1 minute to 10 minutes and starting an intended use of the electron gun chamber in which the electron emitter emits an electron beam along a beam axis.

10. The method according to claim 1, wherein generating the plasma and applying the negative potential to the at least one surface includes generating the plasma and applying the negative potential to the at least one surface in-situ.

11. An ultra high vacuum electron gun chamber comprising:
an electron emitter for generating an electron beam;
a gas inlet for introducing a plasma generating gas;
a discharge electrode located in the electron gun chamber near the electron emitter for generating a plasma in a plasma region containing the electron emitter from the plasma generating gas as a plasma ion source;
at least one beam shaping element; and
a high voltage power supply for providing a negative potential;
wherein at least one surface of the at least one beam shaping element is electrically connected to the high voltage power supply and wherein the negative potential extracts an ion flux from the plasma ion source to the at least one surface to desorb contamination particles therefrom, and the ion flux has substantially the same origin as the electron beam generated by the electron emitter during operation.

12. The electron gun chamber according to claim 11, wherein the electron emitter is selected from a group consisting of: a Schottky emitter and a cold field emitter.

13. The electron gun chamber according to claim 11, wherein the discharge electrode is ring-like and the electron emitter is substantially in the center of the ring-like electrode.

14. The electron gun chamber according to claim 13, wherein the at least one surface of the at least one beam shaping element comprises a surface of an extractor.

15. The electron gun chamber according to claim 11, wherein the electron gun chamber is adapted for in situ pre-treatment by ion stimulated desorption.

16. An electron beam device for a process chosen from specimen inspection, specimen modification and combinations thereof, the electron beam device comprising an ultra high vacuum electron gun chamber adapted for pre-treatment by ion stimulated desorption, the electron gun chamber comprising:
an electron emitter for generating an electron beam;
a gas inlet for introducing a plasma generating gas;
a discharge electrode located in the electron gun chamber near the electron emitter for generating a plasma from the plasma generating gas as a plasma ion source in a plasma region containing the electron emitter;
at least one beam shaping element; and
a high voltage power supply for providing a negative potential;
wherein at least one surface of the at least one beam shaping element is electrically connected to the high voltage power supply and wherein the negative potential extracts an ion flux from the plasma ion source to the at least one surface to desorb contamination particles therefrom, and the ion flux has substantially the same origin as the electron beam generated by the electron emitter during operation.

17. The electron beam device according to claim 16, further comprising a specimen chamber comprising:
a specimen holder for placing a specimen thereon.

18. The electron beam device according to claim 16, wherein the at least one surface of the at least one beam shaping element comprises a surface of an extractor.

19. Use of an electron gun chamber to perform a method of pre-treating the electron gun chamber by ion stimulated desorption, wherein the electron gun chamber includes an electron emitter for generating an electron beam, the method comprising:
generating a plasma in a plasma region containing the electron emitter by direct current discharge or by high frequency discharge of a discharge electrode to provide a plasma ion source in the plasma region in the electron gun chamber around the electron emitter; and
applying a negative potential to at least one surface in the electron gun chamber, the at least one surface comprising a surface of an extractor, wherein the negative potential extracts an ion flux from the plasma ion source to the at least one surface for desorbing contamination particles from the at least one surface by the ion flux impinging on the at least one surface, wherein the electron emitter is not biased during pre-treating the electron gun chamber, and the ion flux has substantially the same origin as the electron beam generated by the electron emitter during operation.

20. Use of an electron gun chamber to perform a method of pre-treating the electron gun chamber by ion stimulated desorption, the method comprising:
generating an electron beam from an electron emitter disposed within the electron gun chamber;
introducing a plasma generating gas into the electron gun chamber from a gas inlet;
generating a plasma in a plasma region containing the electron emitter from the plasma generating gas by a discharge electrode located in the electron gun chamber near the electron emitter to provide a plasma ion source in the plasma region;
shaping the electron beam using at least one beam shaping element; and
applying a negative potential from a high voltage power supply to at least one surface of the at least one beam shaping element, wherein the negative potential extracts an ion flux from the plasma ion source to the at least one surface for desorbing contamination particles from the at least one surface by the ion flux impinging on the at least one surface, wherein the electron emitter is not biased during pre-treating the electron gun chamber.

21. A method of pre-treating an ultra high vacuum electron gun chamber by ion stimulated desorption, wherein the electron gun chamber includes an electron emitter for generating an electron beam, the method comprising:

generating a plasma for providing a plasma ion source in a plasma region in the electron gun chamber near the electron emitter; and applying a negative potential to at least one surface in the gun chamber, wherein the negative potential extracts an ion flux from the plasma ion source in the plasma region located near or around the electron emitter to the at least one surface for desorbing contamination particles from the at least one surface by the ion flux impinging on the at least one surface, wherein the ion flux has substantially the same origin as the electron beam generated by the electron emitter during operation, and wherein the at least one surface comprises a surface of an extractor, an anode, an aperture, a condenser lens, and inner walls of the gun chamber.

* * * * *